United States Patent [19]
Yoshida et al.

[11] Patent Number: 5,330,921
[45] Date of Patent: Jul. 19, 1994

[54] METHOD OF FABRICATING SEMICONDUCTOR DEVICE

[75] Inventors: Takehito Yoshida, Moriguchi; Shinichi Ogawa, Neyagawa, both of Japan

[73] Assignee: Matsushita Electric Industrial Co., Ltd., Kadoma, Japan

[21] Appl. No.: 853,642

[22] Filed: Mar. 18, 1992

[30] Foreign Application Priority Data

Mar. 19, 1991 [JP] Japan .................................. 3-54530

[51] Int. Cl.⁵ .......................................... H01L 21/265
[52] U.S. Cl. ........................................ 437/25; 427/44; 427/161; 427/192; 427/200
[58] Field of Search .................. 437/25, 44, 45, 161, 437/192, 200

[56] References Cited

U.S. PATENT DOCUMENTS

| | | |
|---|---|---|
| 4,586,968 | 5/1986 | Coello-Vera . |
| 5,028,554 | 7/1991 | Kita .................................... 437/192 |
| 5,162,259 | 10/1992 | Kular et al. ......................... 437/192 |
| 5,175,118 | 12/1992 | Yoneda ............................... 437/192 |

FOREIGN PATENT DOCUMENTS

| | | |
|---|---|---|
| 62-264643 | 11/1987 | Japan . |
| 1110762 | 4/1989 | Japan . |

OTHER PUBLICATIONS

N. Kobayashi et al., 1986 *Symposium on VLSI Tech., Digest of Tech. Papers,* IEEE Cat. No.: 86, May 28–30, 1986, pp. 49–50 "Comparison of TiSi₂ and WSi₂ Silicided Shallow Junctions for Sub-Micron CMOSs".

V. Probst et al., *Appl. Phys. Letter,* vol. 52, No. 21, pp. 1803–1805, May 23, 1988 "Limitations of TiSi2 as a Source for Dopant Diffusion".

*Primary Examiner*—Brian E. Hearn
*Assistant Examiner*—Kevin M. Picardat
*Attorney, Agent, or Firm*—Ratner & Prestia

[57] ABSTRACT

A method of fabricating a semiconductor device wherein after forming a titanium silicide thin film on a silicon substrate, dopant impurities are implanted into the silicon substrate through the titanium silicide thin film so as to form shallow p+-n junctions in the silicon substrate. At least one of the following conditions (1) to (3) is satisfied: (1) forty to seventy percent of the total implant dose is within the n-type silicon substrate; (2) the projected range is set at the depth corresponding to 90% to 125% of the titanium silicide film thickness; and (3) the dopant dose that comes to rest within the n-type silicon substrate is in the range of $2.0 \times 10^{15}/\text{cm}^2$ to $3.5 \times 10^{15}/\text{cm}^2$.

16 Claims, 6 Drawing Sheets

EXPOSED AREA OF THE SUBSTRATE

FIG. 5A EMBODIMENT

METHOD OF FABRICATING SEMICONDUCTOR DEVICE

BACKGROUND OF THE INVENTION

1. Field of the Invention

This invention relates to a method of fabricating a high-integration, high-speed semiconductor device.

2. Description of the Prior Art

As the packing density of semiconductor integrated circuit devices increases, the size of circuit elements such as MOS transistors reduces. In such devices, the depth of the source/drain p-n junction also must be reduced if proper transistor operation is to be guaranteed. This requirement, however, involves an increase in the parasitic source/drain resistance, and is hence contradictory to the fabrication of MOS transistors with higher operating speeds.

Among methods to solve the above problem, recent attention has been directed to a technique (silicided junction method) whereby a low-resistance, refractory metal silicide layer is formed on a highly doped diffusion layer of a silicon substrate in self-alignment with an exposed region of the silicon substrate. In this method, ion implantation is often used to introduce dopants (impurities for generating electric carriers). When the introduction of dopants is viewed in terms of time relationship to the formation of the silicide layer, a method wherein the dopant implantation is performed after the formation of the silicide layer is proposed, for example, in the 1986 Symposium on VLSI Technology, Digest of Technical Papers (1986), pp. 49-50.

According to the proposed method, ion implantation is carried out in such a manner that most of the total dose comes to rest within the titanium silicide thin film, and a shallow junction is formed by subsequent drive-in (activation) heat treatment. Therefore, this method can serve to minimize the damage done to the silicon substrate by ion implantation, and is said to be very effective in forming shallow p-n junctions.

However, with the above method, the dopant (boron or arsenic) implanted into the titanium silicide layer may become reacted with the constituent metal element (titanium in the case of titanium silicide) in the silicide during the drive-in heat treatment, forming a compound ($TiB_2$ or TiAs) with the dopant, and thus significantly reducing the implanted dose that can be electrically activated in the silicon substrate.

Figure 4:
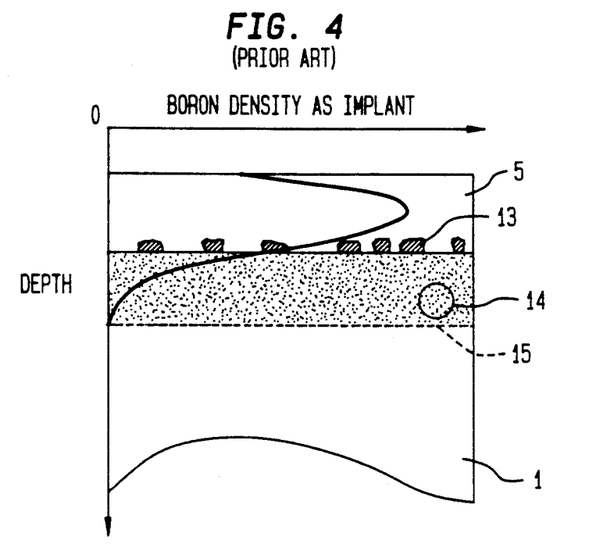
FIG. 4 is a schematic cross sectional view of a silicided junction formed by a prior art semiconductor device fabrication method.

This situation is illustrated in FIG. 4 taking, as an example, a $p^+$-n junction formed by boron implantation. The figure also shows a characteristic curve for the depth versus the boron density of the ion implantation. Under this ion implantation condition, most of the boron (more than 80% of the total implant dose) rests within a titanium silicide layer 5. These boron atoms react with the constituent metal element (titanium) in the titanium silicide to form titanium boride 13 (e.g., $TiB_2$) which is deposited at the titanium silicide/silicon substrate interface. This results in a significant reduction in the amount of boron that can be electrically activated in the silicon substrate 1. Consequently, the density of carriers 14 (holes) existing at the surface region of the n-type silicon substrate 1 is reduced to less than 20% of the total implant dose. The resulting problem is an crease in the contact resistance at the titanium silicide/silicon substrate interface or the inability to form ohmic contacts. In the figure, the reference numeral 15 indicates the $p^+$-n junction.

The above problem is reported, for example, in Applied Physics Letters 52 (1988), pp. 1803-1805.

SUMMARY OF THE INVENTION

The method of fabricating a semiconductor device of this invention, which overcomes the above-discussed and numerous other disadvantages and deficiencies of the prior art, includes the steps of: forming a titanium silicide film at a surface of a semiconductor substrate; implanting dopant ions into the titanium silicide film and the semiconductor substrate; and annealing the semiconductor substrate so as to activate the dopant ions, thereby forming p-n junctions in the semiconductor substrate; and wherein a fraction of the dopant ions implanted into the semiconductor substrate ranges from 40 percent to 70 percent of a total dose of the dopant ions implanted into the titanium silicide film and the semiconductor substrate.

According to another aspect of the invention, a method of fabricating a semiconductor device is provided, including the steps of: forming a titanium silicide film at a surface of a semiconductor substrate; implanting dopant ions into the titanium silicide film and the semiconductor substrate; and annealing the semiconductor substrate so as to activate the dopant ions, thereby forming p-n junctions in the semiconductor substrate; and wherein a projected range of the dopant ions ranges from 90 percent to 125 percent of a thickness of the titanium silicide film.

According to still another aspect of the invention, a method of fabricating a semiconductor device is provided, including the steps of: forming a device isolation film on a semiconductor substrate, the device isolation film having a pattern for exposing active regions of the semiconductor substrate; forming gate lines so as to cover a portion of the active regions of the semiconductor substrate; forming a titanium silicide film in the active regions of the semiconductor substrate in self-alignment with the gate lines; implanting dopant ions into the titanium silicide film and the active regions of the semiconductor substrate; and annealing the semiconductor substrate so as to activate the dopant ions, thereby forming source and drain regions of a transistor in the semiconductor substrate; and wherein a fraction of the dopant ions implanted into the semiconductor substrate ranges from 40 percent to 70 percent of a total does of the dopant ions implanted into the titanium silicide film and the semiconductor substrate.

According to further aspect of the invention, a method of fabricating a semiconductor device is provided, including the steps of: forming a device isolation film on a semiconductor substrate, the device isolation film having a pattern for exposing active regions of the semiconductor substrate; forming gate lines so as to cover a portion of the active regions of the semiconductor substrate; forming a titanium silicide film on the active regions of the semiconductor substrate in self-alignment with the gate lines; implanting dopant ions into the titanium silicide film and the active regions of the semiconductor substrate; and annealing the semiconductor substrate so as to activate the dopant ions, thereby forming source and drain regions of a transistor in the semiconductor substrate; and wherein a projected range of the dopant ions ranges from 90 percent to 125 percent of a thickness of the titanium silicide film.

In a preferred embodiment, a dose of the dopant ions implanted into the semiconductor substrate ranges from $2.0 \times 10^{15}/cm^2$ to $3.5 \times 10^{15}/cm^2$.

According to the above construction of the present invention, while the dopant is introduced through the silicide thin film by ion implantation, the amount of the implanted dopant that can be electrically activated at the surface of the silicon substrate is increased, thereby enabling the formation of a low-resistance, stable ohmic contact at the silicide/silicon substrate interface.

Thus, the invention described herein makes possible the objective of providing a method of fabricating a semiconductor device capable of forming a submicron MOS transistor having a low contact resistance at the silicide/silicon substrate interface and a shallow silicided junction with minimized reduction in the effective channel length because of reduced lateral diffusion of source/drain regions, and without increasing the number of practical VLSI circuit fabrication steps.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

FIGS. 1A through 1D show cross sectional views illustrating a process sequence for forming a shallow silicided p+-n junction using a semiconductor device fabrication method according to the present invention.

Figure 1A:
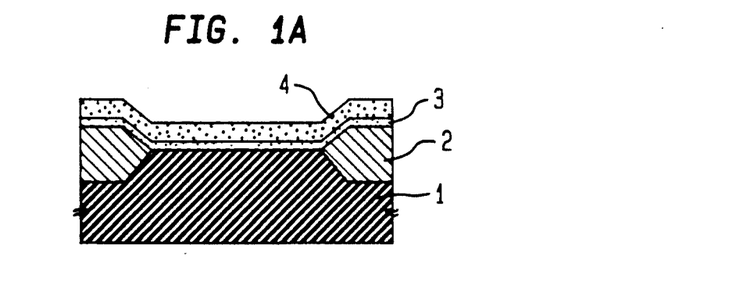
FIGS. 1A–1D show cross sectional views illustrating a process sequence for forming a silicided junction using a fabrication method according to the present invention.

As is shown in FIG. 1A, an oxide film (LOCOS) 2 for device isolation was formed on an n-type silicon substrate 1 of (100) plane orientation. After wet treatment was carried out using a hydrofluoric acid solution to remove the native oxide film on the surface of the n-type silicon substrate 1, sputter etching was performed using argon ions to expose the active surface of the n-type silicon substrate 1. The sputtering condition was so set as to sputter the $SiO_2$ film to a depth of about 7 nm. After such pretreatment, a metal titanium thin film 3 and an amorphous silicon thin film 4 were successively deposited over the entire surface of the n-type silicon substrate 1 by sputter deposition using the same vacuum chamber with a highly evacuated background ($5 \times 10^{-8}$ Torr or lower). At this time, the metal titanium thin film 3 was deposited to a thickness of 35 nm, and the amorphous silicon thin film 4 to a thickness of 75 nm.

Figure 1B:
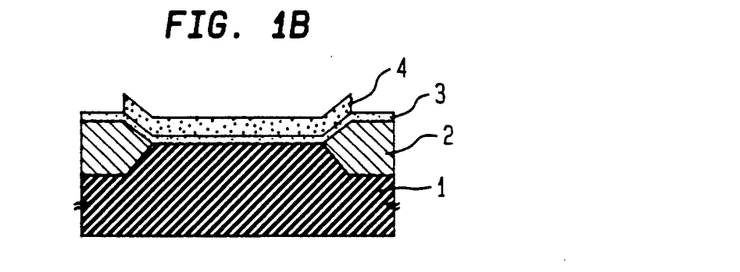

Next, as is shown in FIG. 1B, using a conventional photoresist patterning and dry etching technique, the amorphous silicon thin film 4 is patterned on the metal titanium thin film 3. Since the pattern of the amorphous silicon thin film 4 subsequently defines a titanium silicide layer that acts as a low-resistance cladding layer for diffusion regions, the pattern should be formed so as to cover the entire regions into which diffusions are to be made. Also, the dry etching condition should be so set as to provide sufficiently high selectivity of the amorphous silicon thin film 4 to the metal titanium thin film 3 so that the metal titanium thin film 3 is left after the dry etching of the amorphous silicon thin film 4, as is shown in FIG. 1B.

Figure 1C:
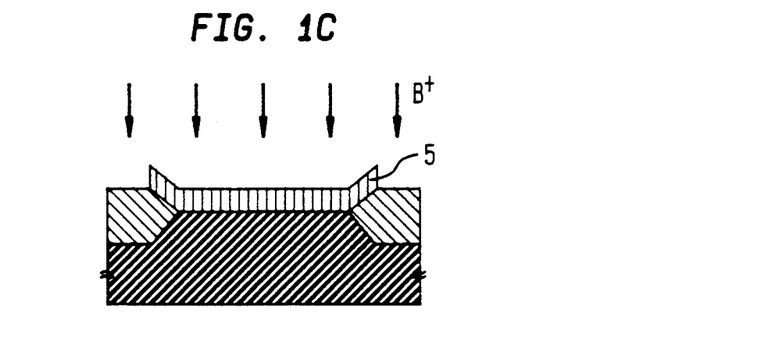

In the next step, using a rapid annealing equipment that can reduce the effect of residual gas and that allows the introduction of nitrogen gas, heat treatment is performed to silicide the metal titanium thin film 3 underneath the amorphous silicon thin film 4. Titanium nitride is formed on the regions of the metal titanium thin film 3 that lie on the device isolation oxide film 2 but which are not covered by the amorphous silicon thin film 4. However, this titanium nitride can be removed selectively, using an $H_2SO_4 + H_2O_2$ solution, leaving the titanium silicide. The titanium silicide layer 5 shown in FIG. 1C is thus formed. The thickness of the titanium silicide layer 5 is 85 nm.

Figure 2:
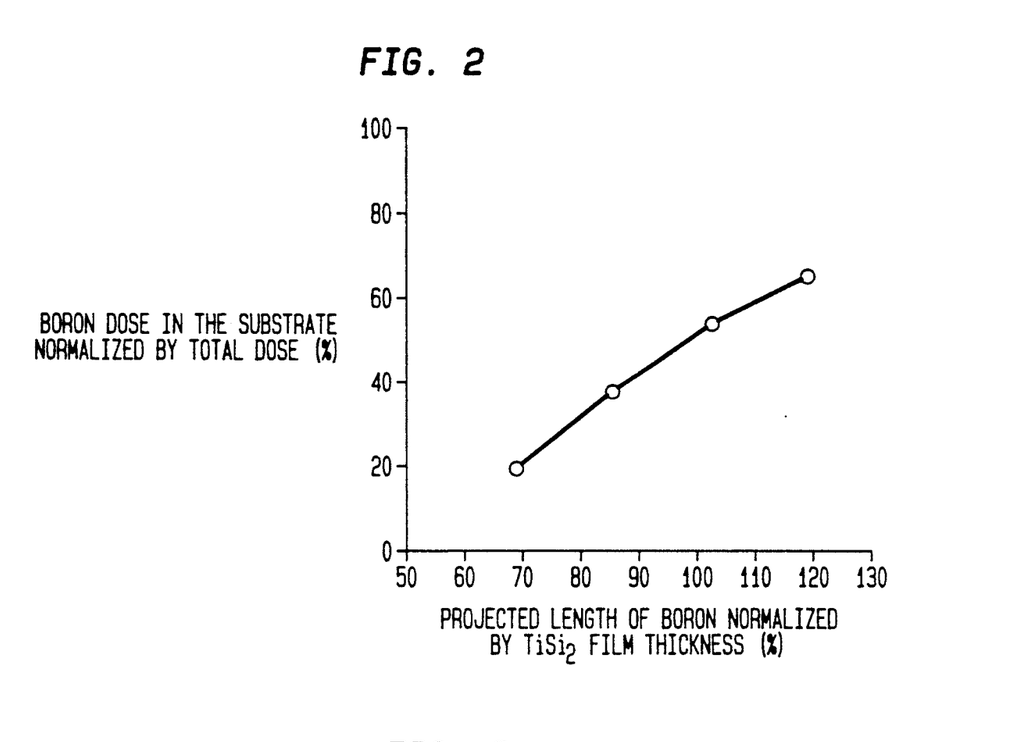
FIG. 2 shows a characteristic curve illustrating the relationship between the projected length of the boron as normalized by the titanium silicide film thickness and the boron dose resting within the silicon substrate as normalized by the total implant dose according to the present invention.

In the above situation, boron ions as the dopant were implanted through the titanium silicide layer 5 to form shallow p+-n junctions. The ion implantation conditions were set as an acceleration energy of 25 keV and a dose of $5 \times 10^{15}/cm^2$. With this acceleration energy, the projected range of the implanted boron ions is set in the vicinity of the interface between the titanium silicide layer 5 and the n-type silicon substrate 1 (the projected range reaches the depth corresponding to 104% of the thickness of the titanium silicide layer 5) so that the majority ($2.7 \times 10^{15}/cm^2$) of the implanted boron ions comes to rest within the n-type silicon substrate 1. FIG. 2 shows a characteristic curve illustrating the relationship between the projected length of the boron ions as normalized by (i.e., as measured against) the titanium silicide film thickness and the boron dose resting within the silicon substrate as normalized by the total implant dose. The titanium silicide film thickness is 85 nm and the total implant dose is $5 \times 10^{15}/cm^2$.

Figure 1D:
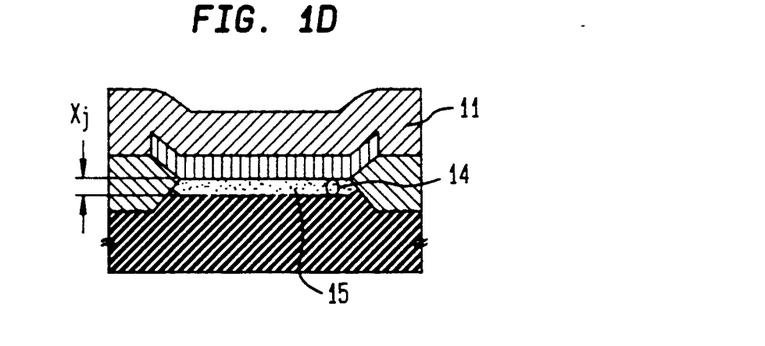

Next, as is shown in FIG. 1D, an interlevel dielectric film 11 was deposited by CVD, and heat treatment was performed in a nitrogen atmosphere at 900° C. for 30 minutes to activate the implanted boron ions, and to densify of the interlevel dielectric film 11 and for planarization of the interlevel dielectric film 11. Although the heat treatment was carried out at a relatively high temperature (900° C.) so as to fully recover the crystalline damages of the silicon substrate, a relatively low temperature heat treatment (e.g., furnace anneal at 850° C. for 30 minutes) can sufficiently activate the implanted boron. Alternatively, a combined heat treatment of a low temperature furnace anneal (at 800° C. for 30 to 60 minutes) and a rapid thermal anneal (at 1000° C. for 10 seconds) may be carried out. The combined heat treatment is more effective than a high temperature furnace anneal so as to prevent the redistribution of the dopant impurities.

During the heat treatment for the activation of the dopant impurities, most of the boron existing within the titanium silicide layer 5 is reacted with titanium silicide ($TiSi_2$) to deposit titanium boride 13 (FIG. 3) at the interface between the titanium silicide layer 5 and the n-type silicon substrate 1. However, the majority of the implanted boron that penetrated below the surface of the n-type silicon substrate 1 can be electrically activated and can contribute to the generation of a sufficient number of carriers (holes) 14 to form an ohmic contact. In this embodiment, since the boron dose of $2.7 \times 10^{15}/cm^2$ is concentrated within the depth of 200 nm below the surface of the n-type silicon substrate 1, it is perfectly possible to form an ohmic contact at the interface between the titanium silicide layer 5 and the n-type silicon substrate 1. The final junction depth measured 250 nm below the surface of the silicon substrate 1.

Figure 3:
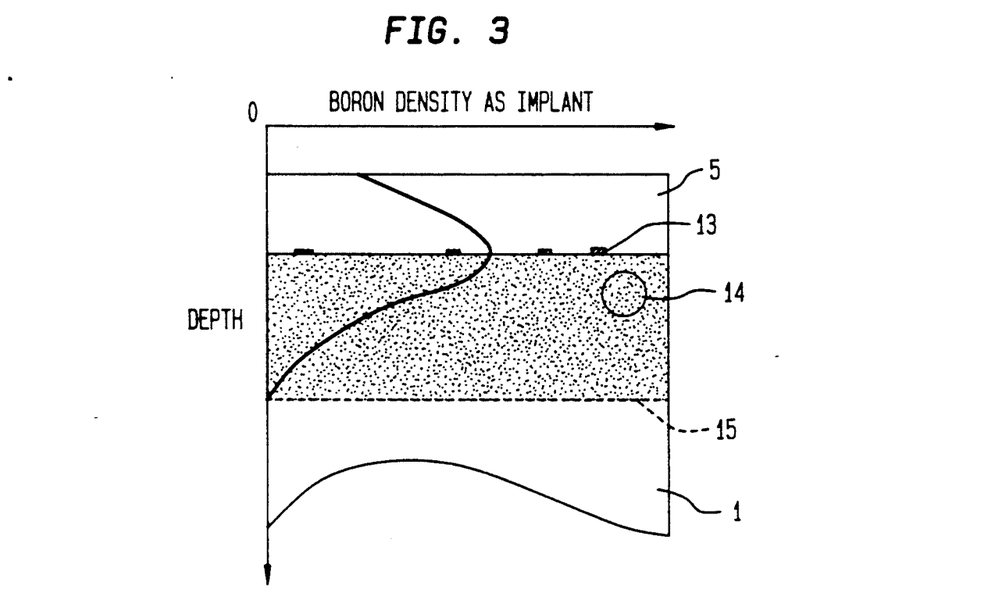
FIG. 3 is a schematic cross sectional view of the silicided junction formed by the semiconductor device fabrication method of the embodiment according to the present invention.

FIG. 3 is a schematic cross sectional view of the silicided junction after the heat treatment. Since the implantation does not affect the crystal quality of the silicon substrate 1, it is possible to reduce the density of secondary defects in the surface region of the silicon substrate 1 and to prevent the induced diffusion of the dopant impurities.

According to the embodiment, since the amorphous silicon thin film 4 deposited by sputter deposition with a highly evacuated background ($5 \times 10^{-8}$ Torr or lower) is inherently low in oxygen content ($1 \times 10^{19}/cm^3$ or lower), no appreciable amount of oxygen enters the titanium silicide layer during the rapid annealing for the silicidation performed in a nitrogen atmosphere, and titanium nitride (TiN) is formed preferentially along the grain boundaries in the titanium silicide layer 5. The titanium nitride has a melting point as high as 2930° C., which is much higher than the melting point 1540° C. of the titanium silicide itself, and therefore very effective in enhancing the thermal stability of the titanium silicide layer 5. Actually, even after the 900° C., 30-minute activation heat treatment, no degradation was observed in the morphology of the titanium silicide layer 5 due to agglomeration.

Figure 5A:
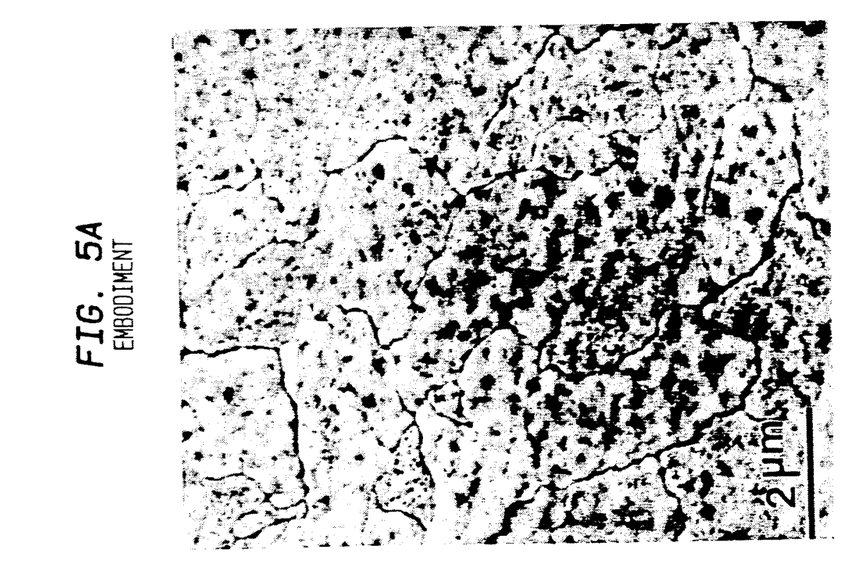
FIG. 5A is a diagram showing the surface pattern of the silicided junction formed by the semiconductor device fabrication method of one embodiment in accordance with the present invention.
Figure 5B:
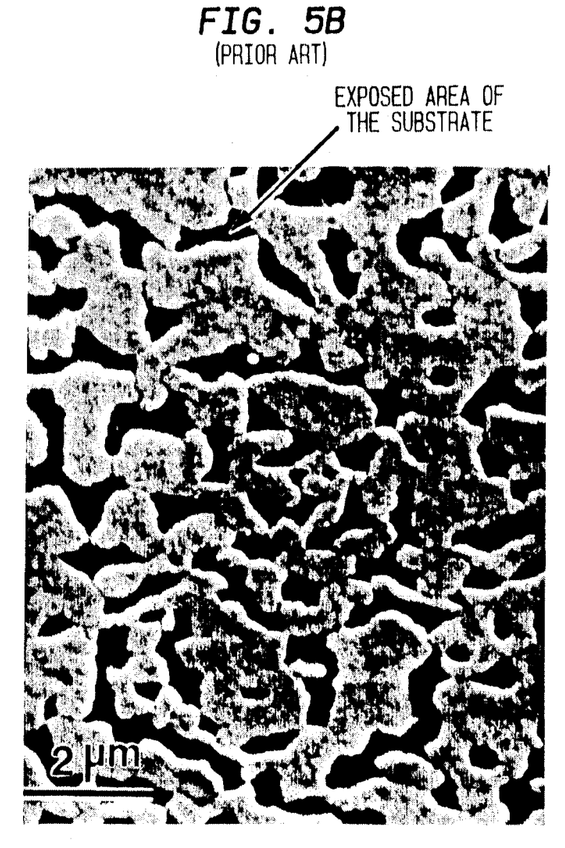
FIG. 5B is a diagram for comparison, showing the surface pattern of the silicided junction formed by the prior art semiconductor device fabrication method, the surface pattern shown being after activation heat treatment.

FIG. 5A shows the surface pattern of the titanium silicide layer 5 formed in accordance with the present invention. For comparison, FIG. 5B shows the surface pattern of a titanium silicide layer formed by a prior art silicide process, the surface pattern shown being after a 900° C., 30-minute activation heat treatment. It can be seen from FIG. 5B that, as a result of the heat treatment, degradation has been caused in the morphology of the titanium silicide layer due to agglomeration, exposing portions of the silicon substrate underneath.

FIGS. 6A through 6E show cross sectional views illustrating a process sequence for forming source/drain diffusion regions of a p-channel MOS transistor for which the fabrication method of the present invention is applied.

Figure 6A:
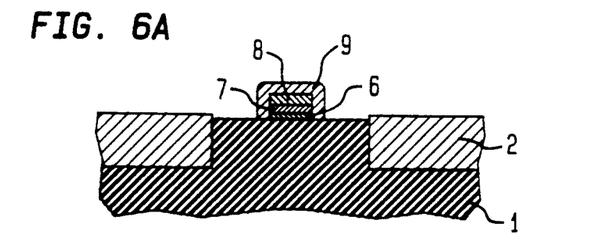
FIGS. 6A–6E show cross sectional views illustrating a process sequence for forming source/drain regions of an MOS transistor for which the semiconductor device fabrication method in one embodiment according to the present invention is applied.

As is shown in FIG. 6A, a device isolation oxide film 2 and a polysilicon gate electrode 7 with an underlying gate oxide film 6 are patterned on an n-type silicon substrate 1 of (100) plane orientation. After that, a CVD oxide film g covering the polysilicon gate electrode 7 is formed. Simultaneously with the patterning of the polysilicon gate electrode 7, a titanium silicide thin film 8 deposited by sputter deposition on top of the polysilicon gate 7 is also patterned, so that the gate electrode has a polycide structure.

Figure 6B:
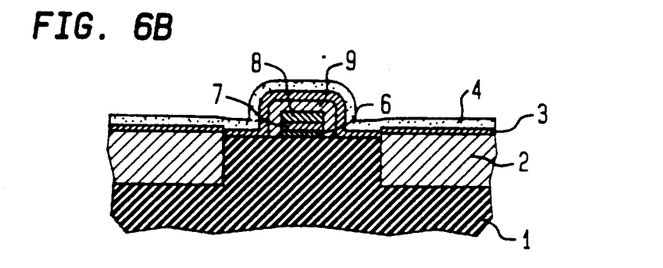
Figure 6C:
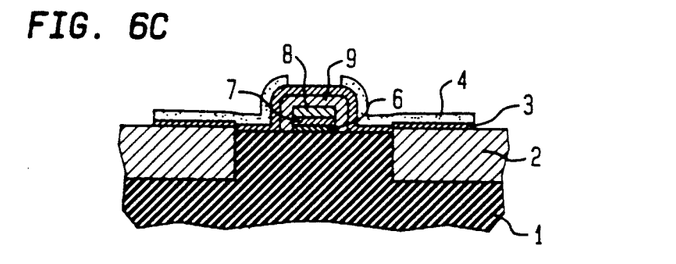

In the steps represented by FIG. 6B onward, the source/drain diffusion layer 10 of the p-channel MOS transistor can be formed by the silicided junction method following exactly the same process as the fabrication process illustrated in FIG. 1A through 1D.

As is shown in FIG. 6B, a metal titanium thin film 3 (35 nm) and an amorphous silicon thin film 4 (75 nm) were successively deposited over the entire surface of the n-type silicon substrate 1. Next, in the step represented in FIG. 6C, using a conventional photoresist patterning and dry etching technique, the amorphous silicon thin film 4 is patterned on the metal titanium thin film 3. At this time, the pattern of the amorphous silicon thin film 4 should be formed so as to cover the entire region where the source/drain diffusion layer 10 is to be formed.

Figure 6D:
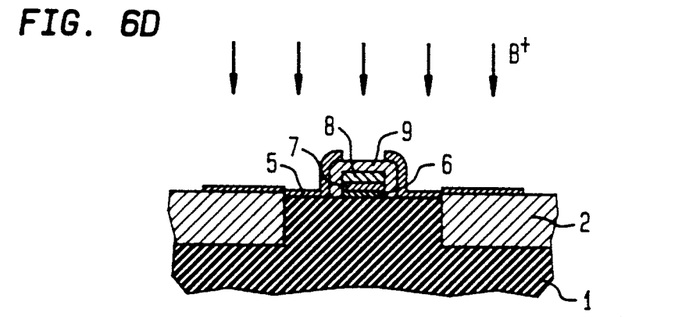

In the next step relating to FIG. 6D, using rapid annealing equipment with nitrogen gas introduced therein, heat treatment is performed to silicide the metal titanium thin film 3 underneath the amorphous silicon thin film 4. The titanium nitride formed on the regions of the metal titanium thin film 3 that lie on the device isolation oxide film 2, but that are not covered by the amorphous silicon thin film 4, is then removed selectively, using an $H_2SO_4 + H_2O_2$ solution, leaving the titanium silicide. The titanium silicide layer 5 (85 nm) shown in FIG. 6D can thus be formed.

In this situation, boron ions as the dopant were implanted through the titanium silicide layer 5 to form shallow $p^+$-n junctions. The ion implantation conditions were set at an acceleration energy of 25 keV and a dose of $5 \times 10^{15}/cm^2$. With this acceleration energy, the projected range of the implanted boron is set in the vicinity of the interface between the titanium silicide layer 5 and the n-type silicon substrate 1 (the projected range reaches the depth corresponding to 104% of the thickness of the titanium silicide layer 5) so that, out of the implanted boron, the boron of $2.7 \times 10^{15}/cm^2$ comes to rest within the n-type silicon substrate 1.

Figure 6E:
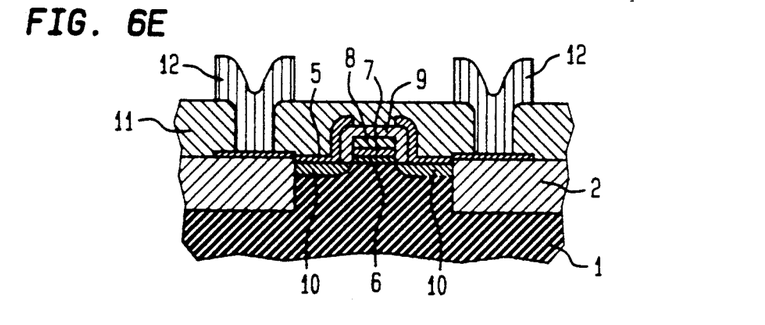

Next, in the step represented in FIG. 6E, an interlevel dielectric film 11 is deposited by CVD, and heat treatment is performed in a nitrogen atmosphere at 900° C. for 30 minutes to activate the implanted boron dopant, and to densify and to planarize the interlevel dielectric film 11. Then, after opening contact holes by dry etching, an aluminum interconnection pattern 12 having a barrier metal of a titanium nitride (TiN)/titanium (Ti) stacked structure is formed on the titanium silicide layer 5 in the regions thereof under which the device isolation oxide film 2 is formed. By performing heat treatment at about 450° C. in a hydrogen gas mixed nitrogen gas atmosphere, as is required, the radiation damage suffered during the dry etching for opening the contact holes can be restored, thus completing the fabrication of a silicided junction MOS transistor having good electrical characteristics.

Figure 7:
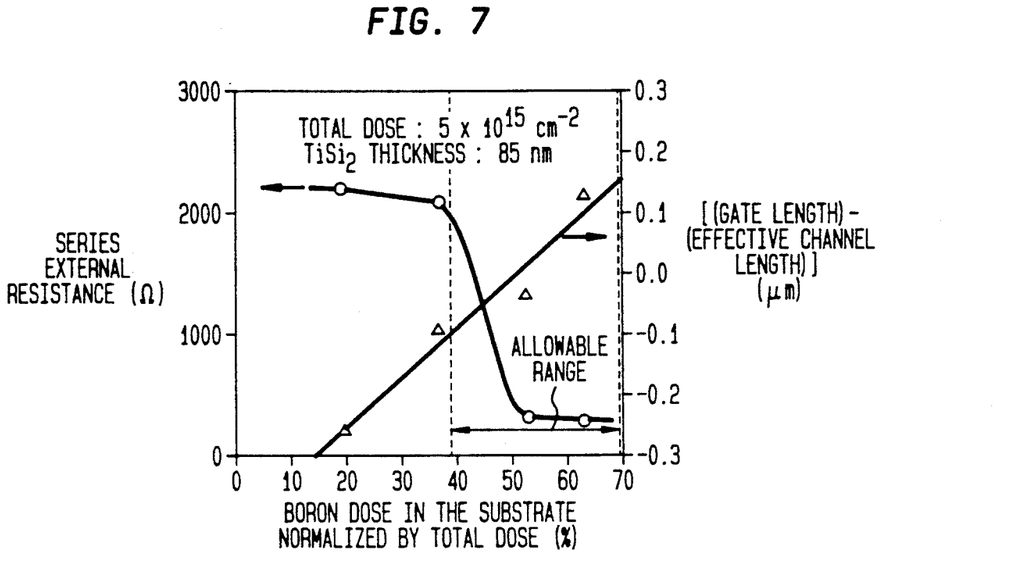
FIG. 7 pertains to the same embodiment according to the present invention and shows characteristic curves depicting the series external resistance of the MOS transistor and the difference between polysilicon gate length and effective channel length as a function of the boron dose resting within the silicon substrate as normalized by the total implant dose.

FIG. 7 shows characteristic curves for the p-channel MOS transistor which is fabricated according to the method of this embodiment, obtained by varying the boron ion implantation energy from 15 keV to 30 keV with the total implant dose fixed to $5 \times 10^{15}/cm^2$. The series external resistance of the MOS transistor and the difference between polysilicon gate length and effective channel length are respectively plotted as a function of the boron dose resting within the n-type silicon substrate as normalized by the total implant dose.

As can be seen from FIG. 7, the series external resistance of the MOS transistor begins to drop steeply from 2100 ohms when the percentage of the boron dose resting within the n-type silicon substrate (the total implant dose is $5 \times 10^{15}/cm^2$) exceeds 40%, and decreases down to 300 ohms at 53% at which point the difference between polysilicon gate length and effective channel length is 0.02 μm. When the percentage of the boron dose resting within the n-type silicon substrate exceeds 63%, the series external resistance remains approximately 300 ohms while the difference between polysilicon gate length and effective channel length increases up to 0.14 μm.

Figure 8:
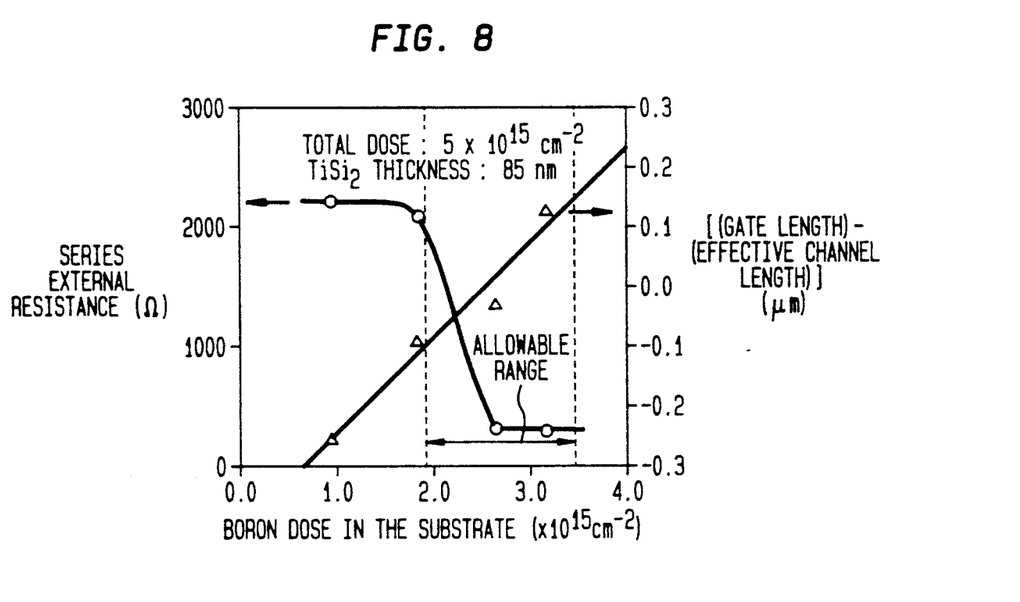
FIG. 8 pertains to the same embodiment according to the present invention and shows characteristic curves depicting the series external resistance of the MOS transistor and the difference between polysilicon gate length and effective channel length as a function of the boron dose resting within the silicon substrate.

Thus, in determining submicron p-channel MOS transistor performance, it is believed to be appropriate that the lower limit of the boron dose made to rest within the n-type silicon substrate be determined by the value at which the series external resistance begins to drop steeply from the 2000-ohm level and the upper limit thereof by the value at which the difference between polysilicon gate length and effective channel length remains smaller than 0.15 μm. These limits define the dopant dose resting within the n-type silicon substrate inside of the range from 40% to 70% of the total implant dose. This means that, within this range, if the dose of the boron that can be electrically activated in the n-type silicon substrate is increased to reduce the series external resistance of the MOS transistor (primarily, the titanium silicide to silicon substrate contact resistance), neither an increase in the source/drain diffusion junction depth nor appreciable decrease in the effective channel length due to lateral diffusions resulting therefrom will occur. The absolute value of the boron dose resting within the n-type silicon substrate can be easily calculated from the measurement of the boron dose resting within the n-type silicon substrate against the total implant dose. FIG. 8 shows characteristic curves depicting the series external resistance of the MOS transistor and the difference between polysilicon gate length and effective channel length as a function of the boron dose resting within the in-type silicon substrate.

The upper and lower limits of the boron dose made to rest within the n-type silicon substrate can be derived from FIG. 8 in a similar way to that described in connection with FIG. 7. As is shown, the limits of the dopant dose in the n-type silicon substrata lie in the range of $2.0 \times 10^{15}/cm^2$ to $3.5 \times 10^{15}/cm^2$.

As previously shown in FIG. 2, there exists a unique relationship between the projected length of the boron as normalized by the =titanium silicide film thickness and the boron dose resting within the silicon substrate as normalized by the total implant dose. Therefore, it is also possible to present characteristic curves depicting the series external resistance of the MOS transistor and the difference between polysilicon gate length and effective channel length as a function of the projected length of the boron as normalized by the titanium silicide film thickness.

Figure 9:
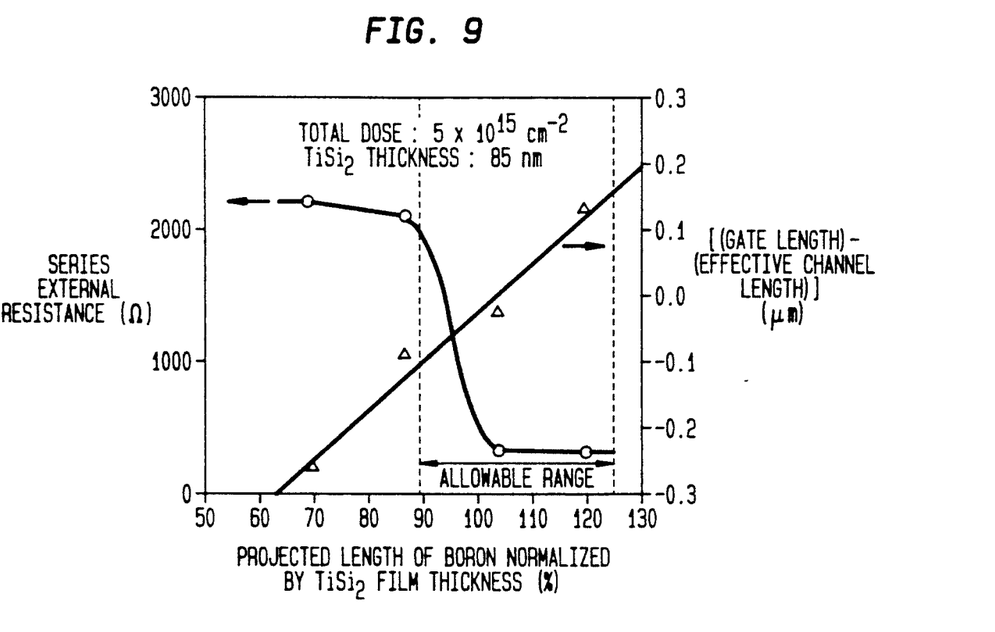
FIG. 9 pertains to the same embodiment according to the present invention and shows characteristic curves depicting the series external resistance of the MOS transistor and the difference between polysilicon gate length and effective channel length as a function of the projected length of the boron as normalized by the titanium silicide film thickness.

The upper and lower limits of the projected length of the boron as normalized by the titanium silicide film thickness can be derived from FIG. 9 in a similar way to that described in connection with FIG. 7. As is shown, the limits of the projected length of the boron lie in the range of 90% to 125% of the titanium silicide film thickness. Also, if the projected length of the boron is set within the range of 90% to 100% of the titanium silicide film thickness, the projected range of the ion implantation comes inside the titanium silicide layer 5, which very effectively inhibits the secondary defect density induced on the surface of the n-type silicon substrate 1 and accelerated diffusion of the implanted dopant.

The optimum conditions for the boron ion implantation in this invention can be summarized as follows:

When the titanium silicide thin layer 5 is formed on the silicon substrate 1 and the dopant is ion-implanted through this titanium silicide thin layer 5 to form the shallow p+-n junctions in the n-type silicon substrate 1, one of the following conditions (1) to (3) should be satisfied.

(1) Forty to seventy percent of the total implant dose should come to rest within the n-type silicon substrate.

(2) The dopant dose that comes to rest within the n-type silicon substrate should be in the range of $2.0 \times 10^{15}/cm^2$ to $3.5 \times 10^{15}/cm^2$.

(3) The projected range should be set at the depth corresponding to 90% to 125% of the titanium silicide film thickness.

The above description has dealt with the fabrication method of the present invention specifically applied to the formation of source/drain diffusion regions of a MOS transistor, but it is to be understood that the embodiment illustrated in FIGS. 1 to 3 can be applied to the formation of base contact and emitter regions for the fabrication of a high-performance bipolar transistor.

As is described above, according to the present invention, when the dopant is ion-implanted through the silicide thin film, 40% to 70% of the total implant dose is made to rest within the silicon substrata, thereby increasing the amount of the implanted dopant that can be activated at the surface of the silicon substrate and thus making it possible to form a low-resistance, stable ohmic contact at the silicide/silicon substrate interface. The invention therefore offers great advantage for the fabrication of submicron semiconductor devices.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed:

1. A method of fabricating a semiconductor device, comprising the steps forming a titanium silicide film on semiconductor substrate;

implanting dopant ions into said titanium silicide film and said semiconductor substrate; and annealing said semiconductor substrate so as to activate said dopant ions, thereby forming p-n junctions in said semiconductor substrate; and wherein a fraction of said dopant tons implanted into said semiconductor substrate ranges from 40 percent to 70 percent of a total dose of said dopant ions implanted into said titanium silicide film and said semiconductor substrate.

2. A method according to claim 1, wherein a dose of said dopant ions implanted into said semiconductor substrate ranges from $2.0 \times 10^{15}/cm^2$ to $3.5 \times 10^{15}/cm^2$.

3. A method of fabricating a semiconductor device, comprising the steps of:

forming a titanium silicide film on a surface of a semiconductor substrate;

implanting dopant ions into said titanium silicide film and said semiconductor substrate; and annealing said semiconductor substrate so as to activate said dopant ions, thereby forming p-n junctions in said semiconductor substrate; and wherein a projected range of said dopant ions ranges from 90 percent to 125 percent of a thickness of said titanium silicide film.

4. A method according to claim 3, wherein a dose of said dopant ions implanted into said semiconductor substrate ranges from $2.0 \times 10^{15}/cm^2$ to $3.5 \times 10^{15}/cm^2$.

5. A method of fabricating a semiconductor device, comprising the steps of:

forming a device isolation film on a semiconductor substrate, said device isolation film having a pattern for exposing active regions of said semiconductor substrate;

forming gate lines so as to cover a portion of said active regions of said semiconductor substrate;

forming a titanium silicide film on said active regions of said semiconductor substrate in self-alignment with said gate lines;

implanting dopant ions into said titanium silicide film and said active regions of said semiconductor substrate; and annealing said semiconductor substrate so as to activate said dopant ions, thereby forming source and drain regions of a transistor in said semiconductor substrate; and wherein a fraction of said dopant ions implanted into said semiconductor substrate ranges from 40 percent to 70 percent of a total dose of said dopant ions implanted into said titanium silicide film and said semiconductor substrate.

6. A method according to claim 5, wherein a dose of said dopant ions implanted into said semiconductor substrate ranges from $2.0 \times 10^{15}/cm^2$ to $3.5 \times 10^{15}/cm^2$.

7. A method of fabricating a semiconductor device, comprising the steps of:

forming a device isolation film on a semiconductor substrate, said device isolation film having a pattern for exposing active regions of said semiconductor substrate;

forming gate lines so as to cover a portion of said active regions of said semiconductor substrate;

forming a titanium silicide film on said active regions of said semiconductor substrate in self-alignment with said gate lines;

implanting dopant ions into said titanium silicide film and said active regions of said semiconductor substrate; and annealing said semiconductor substrate so as to activate said dopant ions, thereby forming source and drain regions of a transistor in said semiconductor substrate; and wherein a projected range of said dopant ions ranges from 90 percent to 125 percent of a thickness of said titanium silicide film.

8. A method according to claims 7, wherein a dose of said dopant ions implanted into said semiconductor substrate ranges from $2.0 \times 10^{15}/cm^2$ to $3.5 \times 10^{15}/cm^2$.

9. A method for fabricating a semiconductor device, comprising the steps of;

forming a titanium silicide film on a surface of a semiconductor substrate;

implanting dopant ions into said titanium silicide film and said semiconductor substrate, said dopant ions being boron ions; and annealing said semiconductor substrate so as to activate said dopant ions, thereby forming p+-n junctions in said semiconductor substrate; and wherein a fraction of said dopant ions implanted into said semiconductor substrate ranges from 40 percent to 70 percent a total dose of said dopant ions implanted into said titanium silicide film and said semiconductor substrate.

10. A method according to claim 9, wherein a dose of said dopant ions implanted into said semiconductor substrate ranges from $2.0 \times 10^{15}/cm^2$ to $3.5 \times 10^{15}/cm^2$.

11. A method of fabricating a semiconductor device, comprising the steps of:

forming a titanium silicide film on a surface of a semiconductor substrate;

implanting dopant ions into said titanium silicide film and said semiconductor substrate, said dopant ions being boron ions; and annealing said semiconductor substrate so as to activate said dopant ions, thereby forming p+-n junction in said semiconductor substrate; and wherein a projected range of said dopant ions ranges from 90 percent to 125 percent of a thickness of said titanium silicide film.

12. A method according to claim 11, wherein a dose of said dopant ions implanted into said semiconductor substrate ranges from $2.0 \times 10^{15}/cm^2$ to $3.5 \times 10^{15}/cm^2$.

13. A method of fabricating a semiconductor device, comprising the steps of:

forming a device isolation film on a semiconductor substrate, said device isolation film having a pattern for exposing active regions of said semiconductor substrate;

forming gate lines so as to cover a portion of said active regions of said semiconductor substrate;

forming a titanium silicide film on said active regions of said semiconductor substrate in self-alignment with said gate lines;

implanting dopant ions into said titanium silicide film and said active regions of said semiconductor substrate, said dopant ions being boron ions;

annealing said semiconductor substrate so as to activate said dopant ions, thereby forming p+-source and p+-drain regions of a transistor in said semiconductor substrate; and wherein a fraction of said dopant ions implanted into said semiconductor substrate ranges from 40 percent to 70 percent of a total dose of said dopant ions implanted into said titanium silicide film and said semiconductor substrate.

14. A method according to claim 13, wherein a dose of said dopant ions implanted into said semiconductor substrate ranges from $2.0 \times 10^{15}/cm^2$ to $3.5 \times 10^{15}/cm^2$.

15. A method of fabricating a semiconductor device, comprising the steps of:

forming a device isolation film on a semiconductor substrate, said device isolation film having a pattern for exposing active regions of said semiconductor substrate;

forming gate lines so as to cover a portion of said active regions of said semiconductor substrate;

forming a titanium silicide film on said active regions of said semiconductor substrate in self-alignment with said gate lines;

implanting dopant ions into said titanium silicide film and said active regions of said semiconductor substrate, said dopant ions being boron ions;

annealing said semiconductor substrate so as to activate said dopant ions, thereby forming p+-source and p+-drain regions of a transistor in said semiconductor substrate; and wherein a projected range of said dopant ions ranges from 90 percent to 125 percent of a thickness of said titanium silicide film.

16. A method according to claim 15, wherein a dose of said dopant ions implanted into said semiconductor substrate ranges from $2.0 \times 10^{15}/cm^2$ to $3.5 \times 10^{15}/cm^2$.

* * * * *

UNITED STATES PATENT AND TRADEMARK OFFICE
CERTIFICATE OF CORRECTION

PATENT NO.   : 5,330,921
DATED        : July 19, 1994
INVENTOR(S)  : Yoshida et al.

It is certified that error appears in the above-identified patent and that said Letters Patent is hereby corrected as shown below:

Column 9, line 9, after the word
 "steps" insert --of:--.

Column 9, line 10, after the
 word "on" insert --a surface of a--.

Column 9, line 17, the word
 "tons" should be --ions--.

Column 10, line 35 after the
 word "percent" insert --of--.

Signed and Sealed this

First Day of November, 1994

*Attest:*

BRUCE LEHMAN

*Attesting Officer*   *Commissioner of Patents and Trademarks*